United States Patent [19]
McLaughlin et al.

[11] 3,826,957
[45] July 30, 1974

[54] DOUBLE-SIDED HEAT-PIPE COOLED POWER SEMICONDUCTOR DEVICE ASSEMBLY USING COMPRESSION RODS

[75] Inventors: Michael H. McLaughlin, Scotia; Gunnar E. Walmet, Schenectady; James C. Corman, Scotia, all of N.Y.

[73] Assignee: General Electric Company, Schenectady, N.Y.

[22] Filed: July 2, 1973

[21] Appl. No.: 375,810

[52] U.S. Cl. .................. 317/234 R, 62/119, 165/80, 165/105, 174/15, 317/234 B, 317/234 P
[51] Int. Cl. .............................. H01l 3/00, H01l 5/00
[58] Field of Search .................... 317/234, 1, 1.5, 6; 165/80, 105; 62/119; 174/15

[56] References Cited
UNITED STATES PATENTS

| | | | |
|---|---|---|---|
| 3,739,234 | 6/1973 | Bylund et al. | 317/234 |
| 3,739,235 | 6/1973 | Kessler | 317/234 |
| 3,746,947 | 7/1973 | Yamamoto | 317/234 |

*Primary Examiner*—Andrew J. James
*Attorney, Agent, or Firm*—Louis A. Moucha; Joseph T. Cohen; Jerome C. Squillaro

[57] ABSTRACT

Two groups of rods disposed perpendicular to opposite ends of a replaceable power semiconductor device assembly have a compressive force applied thereto for causing uniform high pressure contact of two pressure plates against opposite ends of the semiconductor device assembly. The pressure plates are the evaporating surface ends of two heat pipes used for cooling the semiconductor device. The uniformly high pressure interfaces developed by the pressure plates within and against the semiconductor assembly results in a relatively low thermal resistance of the semiconductor device-to-heat pipe interfaces to produce improved vaporization cooling of the semiconductor device.

33 Claims, 5 Drawing Figures

DOUBLE-SIDED HEAT-PIPE COOLED POWER SEMICONDUCTOR DEVICE ASSEMBLY USING COMPRESSION RODS

Our invention relates to a mounting assembly for a power semiconductor device which is used in conjunction with heat pipe cooling, and in particular, to an assembly which permits easy removal of the device and utilizes compression rods for developing uniformly high pressure interfaces within the semiconductor device and between it and the heat pipe evaporating surfaces.

Semiconductor devices of various types are constantly being fabricated in larger sizes for power applications as distinguished from signal applications. The larger size of the device and higher current and power rating thereof requires an efficient means for removal of the heat generated within the device to maintain operation thereof within its rated steady-state and transient temperature limits. Since the future trend undoubtedly will be to increase the power rating of semiconductor devices even beyond those presently utilized, it is readily apparent that more efficient cooling means must be provided for such power devices.

Conventional cooling systems for power semiconductor devices are generally in the form of a water cooled heat sink or air cooled finned heat sink which uses conduction heat transfer within the body of the heat sink as the means for transferring heat from the semiconductor device.

More recently developed devices for cooling power semiconductor devices are heat pipes which effect heat transfer by vaporization of a liquid phase of a two-phase fluid coolant contained within a sealed chamber or pipe, by the application of heat to a vaporization, or evaporator, section of the chamber. The vaporization section of the heat pipe thus receives heat from the device being cooled and the heated vapor, being under a relatively higher vapor pressure, moves to the lower pressure area in the condensation section of the chamber, or pipe, by a substantially isothermal process wherein the vapor condenses and the condensate returns to the evaporator section to be vaporized again and, thus, repeat the heat transfer cycle. The condenser section of the heat pipe is, in effect, an air-cooled surface condenser functioning to reject heat to ambient air. A wick material disposed along substantially the entire inner surface of the heat pipe is conventionally used to pump the condensate to the vaporization section of the heat pipe by capillary action. Since the heat pipe does not utilize conduction as the heat transfer process (except for transferring the heat into and out of the heatpipe), it thereby overcomes a limitation inherent with the conventional finned heat sink due to its reduced efficiency of conduction heat transfer with increased path length, and suggests that the heat pipe may be a superior type device for use in cooling power semiconductor devices.

The first use of heat-pipe cooling of power semiconductor devices known to us is by Heat-Pipe Corporation of America of Westfield, New Jersey whose sales brochure generally describes heat pipes as being used to transport heat from electric motors, semiconductors, brakes and clutches and other heat producing devices.

A publication prepared by the RCA Corporation at Lancaster, Pa. as a final technical report under contract DAAK02-69-0609 dated Oct. 1972 discloses wicked heat-pipe cooled semiconductor thyristor devices in which the wick is in direct contact with the semiconductor device. This assembly, however, does not have the capability available in our invention for removal of the semiconductor device, that is, if the semiconductor device must be replaced, the heat pipe is also lost since the wick is integral therewith. Also, such heat pipe has limited power density due to the wick. Finally, the RCA assembly has the wick in direct contact with the semiconductor device which does not permit any significant heat storage during heat transients. Thus, during a heat transient the RCA assembly would not appear to be able to reduce the resulting temperature rise due to the wick temperature rising at almost the same rate as the heat transient, and probably resulting in the wick material drying out. Our assembly uses a pressure plate as an interface between the semiconductor device and evaporator section of the heat pipe to obtain heat storage during transients. Finally, heat-pipe cooling of power semiconductor devices is also disclosed in a paper entitled APPLICATION OF HEAT PIPES TO THE COOLING OF POWER SEMICONDUCTORS by Edward J. Kroliczek of the Dynatherm Corporation of Cockeysville, Md. which describes the mounting of a power semiconductor device to a heat-pipe assembly which uses two heat pipes for single-sided cooling, each being of small size in cross-section and of flat configuration which significantly increases the thermal resistance. The orientation of the small heat pipes relative to the large cooling fins in the Dynatherm assembly also results in poor heat distribution since conduction heat transfer is required in transferring the heat laterally from the edges of the heat pipes to the outer portions of the fins.

Copending patent applications Ser. No. 356,566 entitled HEAT-PIPE COOLED POWER SEMICONDUCTOR DEVICE ASSEMBLY and Ser. No. 356,565 entitled IMPROVED DOUBLE-SIDED HEAT PIPE COOLED POWER SEMICONDUCTOR DEVICE ASSEMBLY, inventors Corman, et al., filed May 2, 1973 and assigned to the same assignee as the present invention are directed to heat-pipe cooling of power semiconductor devices wherein the semiconductor device is clamped between pressure plates to which a clamping force is applied along the periphery thereof. Although such inventions are satisfactory, it has been found that the peripheral application of a clamping force to the pressure plates results in unequal distribution of pressure along the semiconductor device pressure plates pressure interfaces, especially in the larger diameter size power semiconductor devices, and thereby degrades the thermal and electrical contact thereat.

Therefore, one of the principal objects of our invention is to provide an improved heat-pipe cooling system for power semiconductor devices which obtains a more uniform distribution of pressure across the semiconductor device-support plates pressure interfaces.

Another object of our invention is to provide an improved heat pipe cooled power semiconductor device assembly wherein the semiconductor device is a readily replaceable unit.

Briefly summarized, and in accordance with the objects of our invention, we provide a heat-pipe cooled power semiconductor device assembly which includes an integral power semiconductor device unit mounted between two pressure plates which are clamped together by means of two groups of metal rods disposed within the heat pipes along opposite ends of the semiconductor device unitpressure plate subassembly and axially therewith. A compressive force applied to the far ends of the rods causes a relatively uniform high pressure contact of the pressure plates against opposite ends of the semiconductor device unit. The pressure plates are the evaporating surface ends of the two heat pipes used for double-sided cooling of the semiconductor device, and the rods also function to conduct heat from the evaporating surfaces. The force may be applied to the rods in a recessed portion of the heat pipes, or in a protruding portion thereof. The integral power semiconductor device unit is readily replaceable by removal of the clamping pressure applied to the pressure plates. The uniform and high pressure semiconductor device-to-heat pipe pressure interfaces decrease the steady-state thermal resistance as well as improving the transient response of the cooling system to thereby produce improved vaporization cooling of the semiconductor device.

The features of our invention which we desire to protect herein are pointed out with particularity in the appended claims. The invention itself, however, both as to its organization and method of operation, together with further objects and advantages thereof may best be understood by reference to the following description taken in connection with the accompanying drawings wherein like parts in each of the several figures are identified by the same reference character, and wherein:

Figures 1, 2, 5:
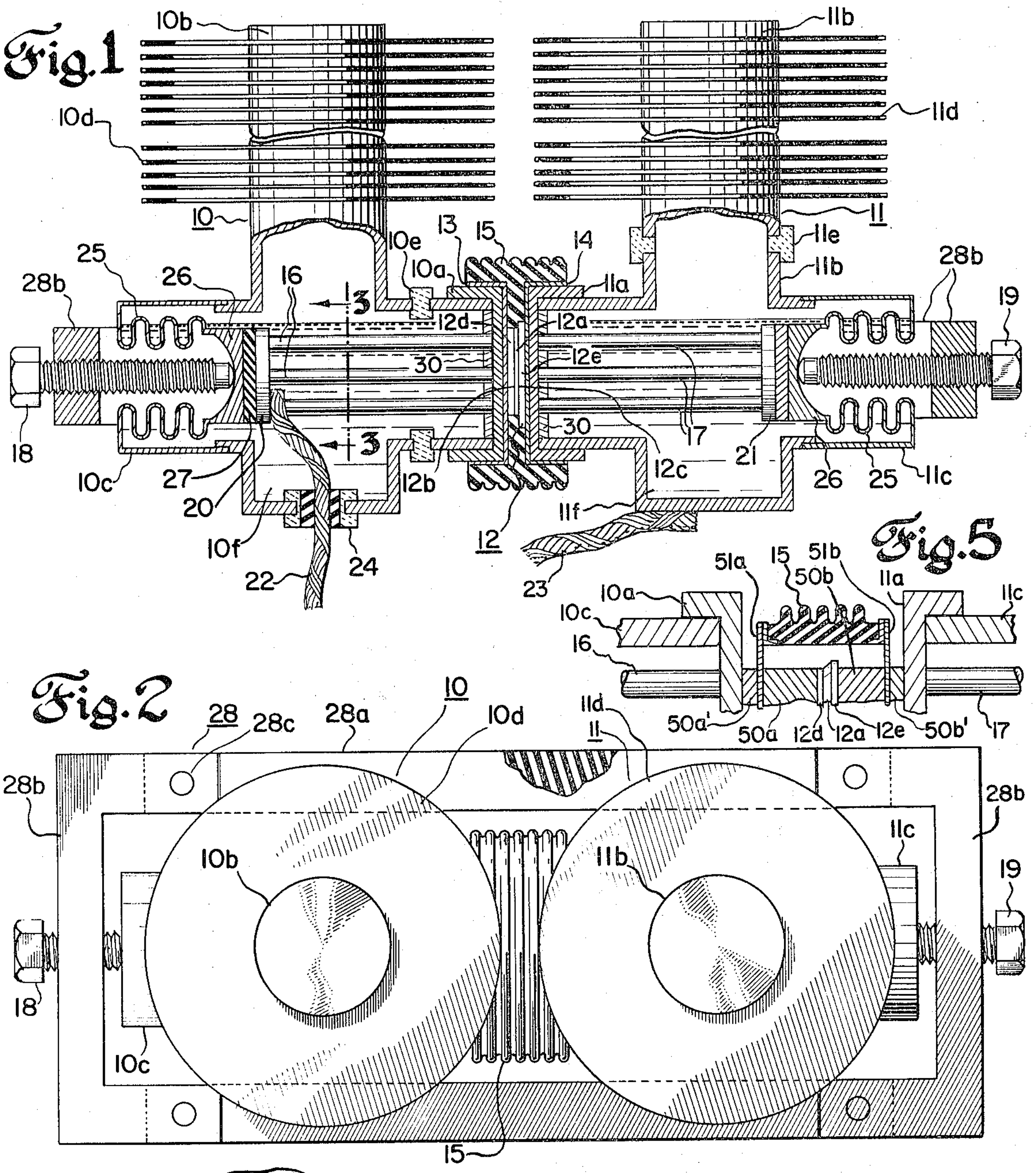
FIG. 1 is an elevation view, partly in section, of our heat-pipe cooled power semiconductor device assembly illustrating a first embodiment of the rod compressive force generating means which is located in a recessed portion of the heat pipes.
FIG. 2 is a top view, partly in section, of the assembly illustrated in FIG. 1 showing a bracket member which is part of the compressive force generating means.
FIG. 5 is a fragmentary view of our assembly utilizing thick heat-conductive spacers in the integral semiconductor device unit.

Referring now in particular to FIG. 1, there is shown a first embodiment of our invention wherein two non-wicked heat pipes of the gravity-return type, and designated as a whole by numerals 10 and 11, are used for obtaining double-sided cooling of a power semiconductor device shown as a whole by numeral 12. Power semiconductor device 12 is depicted as a layered body including a body of semiconductor material 12*a* having first and second flat parallel major surfaces 12*b* and 12*c*, respectively, which define the body of semiconductor material therebetween. The fragile silicon junctions are protected against thermal and mechanical stresses by having the first major surface 12*b* in pressure contact with a first support plate 12*d* and the second major surface 12*c* brazed or otherwise bonded to second support plate 12*e* which is slightly larger in diameter than plate 12*d*. Support plates 12*d* and 12*e* are fabricated of tungsten or molybdenum as two typical metals. Thus, the power semiconductor device is defined herein as including semiconductor body 12*a* and support plates 12*d* and 12*e*. This arrangement prevents cracking or other damage to the semiconductor body which could result from thermal expansion stresses caused by the excursion in junction temperature during transient operation which may be in the order of 200°C. The material of support plates 12*d* and 12*e* must have good electrical and thermal conductivity, be of high strength and have a coefficient of thermal expansion substantially equal to that of the semiconductor material.

Figure 4:
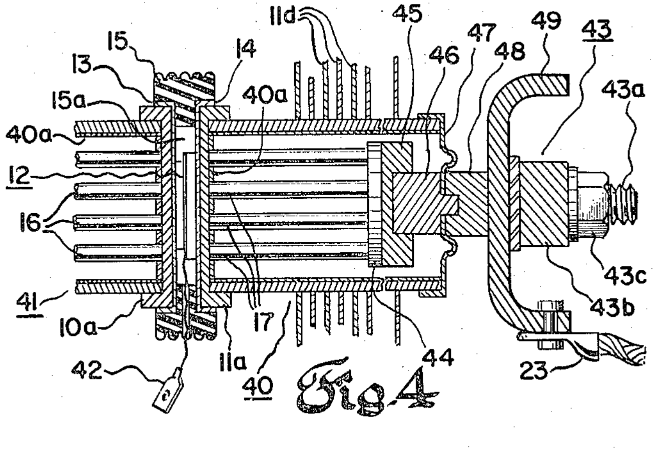
FIG. 4 is an elevation view, partly in section, of part of our heat-pipe cooled power semiconductor device assembly illustrating a second embodiment of the rod compressive force generating means which is located in a protruding portion of the heat pipes.

The power semiconductor device is defined herein as being a device which develops a thermal density of at least 100 watts per square inch along the surfaces thereof. The major surfaces of support plates 12*d* and 12*e* which are spaced from semiconductor body 12*a* are in pressure contact with the outer bottom surfaces of two relatively thin cup-like members 13 and 14 fabricated of a good thermally and electrically conductive material such as copper. The side wall portions of cup members 13 and 14 provide support for a creepage path lengthening means 15 which is a rubber, a ceramic or other electrically insulating material formed along substantially the full height of the side walls of cup members 13 and 14 for increasing the creepage path across the semiconductor device 12 (as well as across the two pressure plates to be described hereinafter). The increased creepage path means 15 may be a ceramic composition, or a silicon rubber composition such as the type RTV produced by the General Electric Company and is preferably formed with an irregular outer surface as illustrated to obtain an even greater creepage path to prevent arc-over between the pressure plates. In the case of a silicone rubber composition 15, it preferably entirely fills the void between cup members 13 and 14 to thereby also provide a dirt-free seal around power semiconductor device 12 and such rubber composition is then run along the outer side surfaces of the cup members as indicated in FIG. 1 to obtain the increased creepage path between the pressure plates. In the case of a ceramic composition 15, as shown in FIGS. 4 (and 5) the ceramic need not fill the entire void between the cup members 13 and 14, and may have a straight bore inner diameter and the remaining space 15*a* between the cup members is preferably back-filled with an inert gas such as nitrogen. The need for increasing the creepage path between pressure plates 10*a* and 11*a* should be evident in view of the small thickness of the integral semiconductor device-cup member unit which may be as small as 140 mils for the hereinafter described dimensions and typical anode-to-cathode potentials of 1,200 volts applied across conductors 22 and 23. The increased creepage path means 15, cup members 13 and 14 and power semiconductor device 12 thus form an integral structure which hereinafter will be described as the integral power semiconductor device unit.

The integral power semiconductor device unit is retained between a pair of U-shaped pressure plates 10*a* and 11*a* by means of slip joints along the inner side surfaces of cup members 13 and 14 and by compression joints between the pressure plates which are the evaporating surface ends of heat pipes 10 and 11. Pressure plates 10*a*, 11*a* are of shape similar to cup members 13, 14 and the side surfaces of pressure plates 10*a* and 11*a* extend beyond the tops of the side surfaces of the cup members 13 and 14, respectively. Pressure plates 10*a* and 11*a* are clamped together in accordance with our invention to be described hereinafter for exerting a relatively high pressure in the order of approximately 2,000 lbs. per square inch uniformly against the power semiconductor device and cup members. A pressure of this magnitude provides pressure interfaces between pressure plate 10*a* and cup member 13, between cup member 13 and support plate 12*d*, between support plate 12*d* and the body of semiconductor material 12*a*, between support plate 12*e* and cup member 14, and between cup member 14 and pressure plate 11*a* which are of good thermal and electrical quality, that is, the smooth flat surfaces are uniformly in sufficient pressure contact to have negligible voids therebetween and thereby result in relatively low thermal and electrical pressure interface resistances in the order of 0.015°C — inch$^2$/watt and $20 \times 10^{-6}$ ohm, respectively. Thus, a total of five "dry" joints are present in our assembly. As a typical example of the dimensions encountered in the pressure interface portion of our heat-pipe cooled power semiconductor device assembly, the body of semiconductor material 12*a* has a thickness of 10 mils and a diameter of 2,000 mils for a 700 ampere, 1,200 volt rated semiconductor device, support plates 12*d* and 12*e* are each of approximately 40 mils thickness, pressure plates 10*a* and 11*a* are each of 100 to 300 mils thickness and cup members 13 and 14 are each of 25 to 100 mils thickness. Pressure plates 10*a* and 11*a* are fabricated of a metal having good electrical and thermal conductivity such as copper, as one example to provide significant heat storage capabilities due to their size and thereby cause dampening of thermal transients that may occur.

Our invention, as noted above, is directed to the clamping means for clamping pressure plates 10*a* and 11*a* together with the integral power semiconductor device unit therebetween. The thermal and electrical resistance of the five semiconductor body-heat pipe pressure interfaces is a function of the surface preparation and magnitude and distribution of the clamping forces. Unsoldered (i.e., "dry" interfaces, and there are five of them here as noted above, require a high clamping force for producing the required approximate 2,000 psi pressure. Such clamping force may easily be in the 4 to 6 ton range for power semiconductor devices having a diameter of 4,000 mils. In order to obtain a uniform pressure distribution across the various pressure interfaces, the clamping force is applied to pressure plates 10*a* and 11*b* by means of two groups of rods 16 and 17 which are preferably fabricated of materials which have good electrical and thermal conductivity, and are of high strength. The number of rods 16, 17 in each group are generally equal and are disposed perpendicular to the bottom surfaces of pressure plates 10*a*, 11*a*. Thus, rods 16, 17 are disposed axially with the integral semiconductor device unit. The compressive force applied to the rods may be developed in a recessed portion of the heat pipes by first type suitable adjustable members 18 and 19 illustrated in FIGS. 1 and 2. Alternatively, the force may be developed in a protruding portion of the heat pipes by second type adjustable members illustrated in FIG. 4.

Figure 3:
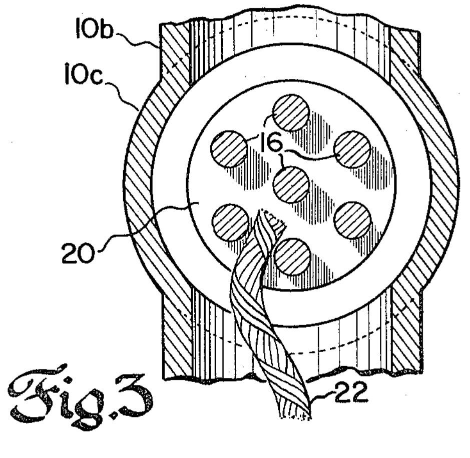
FIG. 3 is a fragmentary sectional view, taken along line 3—3 in FIG. 1.

Referring now to FIGS. 1, 2 and 3, it can be seen that rods 16 and 17 are preferably solid in order to maximize the heat conduction capacity and mechanical strength thereof. And by fabricating the rods of a good electrically conductive material such as copper or copper alloy, they can also function as a current collector for the high current associated with the power semiconductor device. Thus, rods 16, 17 must be sized to (1) transfer heat efficiently away from the semiconductor device, (2) provide sufficient mechanical strength to absorb the force applied thereto, (3) to distribute the clamping pressure relatively uniformly across the inner bottom surfaces of cup members 13, 14 in the regions overlying the semiconductor device, and (4) if functioning as a current collector (i.e., fabricated of a good electrically conductive material), to be capable of conducting at least the rated current of the semiconductor device.

As depicted in FIG. 1, rods 16 and 17 each have their near ends soldered or otherwise suitably joined to the evaporating surfaces of heat pipe evaporating surface end walls (pressure plates) 10*a* and 11*a*, and their far ends likewise joined to cylindrical header members 20 and 21, respectively. Members 20, 21 are fabricated of a high strength, good thermally conductive material such as copper or copper alloy. In the case wherein the rods also function as current collectors, as do rods 16 in FIG. 1, then the material from which member 20 is fabricated must also be a good electrical conductor. In the case wherein the rods do not function as current collectors, as rods 17, then member 21 need not be electrically conductive, although it may be. Rods 16 and 17 may have their far ends soldered or otherwise joined to the near major surfaces of solid header members 20 and 21, respectively. Alternatively, members 20 and 21 may have holes bored completely (or partially) therethrough for the acceptance and soldering of rods 16, 17 therein. The current leads 22 and 23 which supply the electric power to the semiconductor device from an external power supply can be connected to the header members (i.e., internally of the heat pipes) as shown by the lead 22 connection, or can be connected externally of the heat pipes. Less voltage insulation problems are encountered by the former approach, as illustrated, wherein a flexible lead 22 is soldered or otherwise suitably joined to the near major surface of header member 20 as seen in FIGS. 1 and 3, and passes through a suitable electrically insulated bushing 24 in the heat pipe wall. Alternatively, if it is not desired to utilize the rods as current collectors, then the power leads can be connected to external side surfaces of the heat pipes closely adjacent the two evaporating surface ends thereof, as indicated by lead 23. This latter arrangement results in the heat pipe 11 being at the electric potential of lead 23.

A bellows arrangement 25 may be utilized to prevent over-stressing of the vertically oriented heat pipe channels 10*b*, 11*b* during clampdown and for removing any residual stress from the heat pipe evaporating surfaces when unclamped. The bellows 25 have first ends connected along the far ends of horizontally oriented portions 10*c*, 11*c* of the heat pipes, and second ends connected along the protruding ends of backup plate members 26 which are aligned with the center-line axis passing through the center of the integral semiconductor device unit and centers of pressure plates 10*a* and 11*a*. Backup plate members 26 have first concave end surfaces which terminate along the edges thereof in the protrusions along which the bellows 25 are connected thereto. The second ends of backup members 26 are flat and suitably connected as by brazing to like flat ends of the header members 20 and 21. In the case of rods 16 functioning as current collectors, an electrically insulating disk member 27 is connected between members 20 and 26 for electrical isolation of member 26. It should be apparent that in the general case, both heat pipes would have the same type internal and external structure and electrical connections, and FIG. 1 is intended merely to illustrate two different examples.

The force applying member may be a simple rectangular bracket 28 having side members **28*a* functioning as tensile members, and disposed along and parallel to the sides of the integral semiconductor device unit and the sides of heat pipes 10 and 11 which include horizontal portions 10*c* and 11*c*. Bracket 28 has end members 28*b* which are threaded at the centers thereof to accept threaded post members 18, 19 resembling set screws which pass axially therethrough. The shank portions of post members 18 and 19 are parallel to rods 16, 17 and bracket side members 28*a*, and the shank ends of the post members apply the compressive force to the members 26, 20 and 21 and thence to rods 16 and 17, respectively. The shank ends of posts 18, 19 are suitably convex-shaped to provide some freedom against stress concentrations due to possible misalignment of the posts. The bellows 25 also serve to alleviate any possible misalignment problem. Bracket 28 may be a single member, preferably fabricated of a suitable metal, such as steel or copper to withstand the stresses to which it is exposed by virtue of posts 18 and 19 applying compressive forces against rods 16 and 17 and the assembly of the pressure plate and integral semiconductor device unit. However, bracket 28 can only be a single metallic (and assumed to be electrically conductive) member if proper voltage isolation is utilized, as will be described hereinafter. Alternatively, end members 28*b* of bracket 28 may be fabricated of a metal such as steel or copper and side members 28*a* fabricated of an electrically insulating material (as shown) such as fiber glass or Textolite, a General Electric Company registered trademark, if voltage insulation of the tensile members 28*a* is required. In the latter case, suitable pins 28*c*** could be employed to retain the bracket side and end members in a unitary structure.

It is thus evident from the above explanation, and especially with reference to FIG. 1, that the force applied to compression rods 16 and 17 is developed in a recessed portion of heat pipes 10 and 11 as a result of the force exerted by adjustable post members 18 and 19 against the curved surface of members 26. FIG. 4 will illustrate a second embodiment of our invention wherein the force applied to the compression rods 16 and 17 is developed in a protruding portion of the heat pipes.

Referring now to FIG. 3, there is indicated a typical arrangement of the rods 16 (or 17). The rods are parallel to each other and distributed substantially uniformly along the surface of header member 20 (and 21) as well as uniformly along the evaporating surfaces of the heat pipes. Thus, rods 16 as well as rods 17 are preferably equally spaced apart and are of diameter, length, and number appropriate to satisfy the heat transfer, mechanical strength, clamping pressure distribution and current rating conditions enumerated above. As one typical example, 14 rods were used in each group of rods 16 and 17 and distributed over an area having a diameter of 1.5 inch. Each rod was approximately 0.13 inch diameter, 1.5 inch length and fabricated of a zirconium-copper alloy in order to withstand compressive stresses greater than 14,000 psi produced by a clamping force of approximately 2,000 pounds as a minimum. The semiconductor device utilized in the above case had a 550 ampere current and 1,200 voltage rating and was of 33 mm. diameter.

The heat pipes 10, 11 illustrated in FIG. 1, and heat pipes 40 and 41 (shown only in part) illustrated in FIG. 4 are each a sealed chamber or pipe which includes a vaporization or evaporator section that is placed in contact with the source of heat (the semiconductor device to be cooled) and a condensation section which is at the opposite end of the chamber and may be separated by a distance therefrom up to several feet (in the case of heat pipes 10, 11). A two-phase fluid coolant is contained within the heat pipes and effects heat transfer by vaporization of a liquid phase of the coolant resulting from heat conduction through pressure plates (i.e., evaporator section end walls) **10*a* and 11*a* from the power semiconductor device 12 to the evaporator sections of the heat pipes. The vaporization section of each heat pipe thus receives heat from the device being cooled and the heated vapor, being under a relatively higher vapor pressure, moves to the lower pressure area in the condensation section of the heat pipe which functions as a surface condenser where the vapor condenses and the condensate returns to the evaporator section to be vaporized again and, thus, repeats the heat transfer cycle. The condensation sections of the heat pipes have relatively high thermal mass due to the large surface areas thereof, and are preferably provided with finned heat exchangers 10*d*, 11*d* to thereby function as air-cooled surface condensers rejecting heat to ambient air which surrounds the condensation sections. For more efficient removal of the heat to the ambient air, a fan or other means is utilized for obtaining forced air cooling by developing a sufficient air velocity of the ambient air passing by the cooling fins. In conventional heat pipes (i.e., wicked heat pipes such as heat pipes 40, 41 in FIG. 4) the heat pipe is generally oriented horizontally and a capillary pumping structure, or wick 40*a*,** is saturated with the liquid phase of the coolant and is used to "pump" the condensate to the evaporator section of the heat pipe by capillary action.

However, a wick is not essential to the operation of a heat pipe when it is of the gravity-feed type such as heat pipes 10, 11 in FIG. 1, that is, the heat pipe is oriented at some angle from the horizontal which need not be the extreme case of 90° indicated in FIG. 1. In the gravity-feed heat pipe, the condensed fluid returns to the evaporator section by gravity. The omission of the wick material along the various inner surfaces of the gravity-return heat pipe results in reduced thermal resistance since the wick adds another thermal resistance (loss) component into the system. Further, the use of a wicked heat pipe limits the effective length of the heat pipe that may be used since the pumping losses associated with the wick increase with heat pipe length. For these reasons, a preferred embodiment of our cooling system employs the gravity-return heat pipe as illustrated in FIGS. 1 and 2, and as a result obtains more efficient cooling although the wicked heat pipes may alternatively be used, if desired. The same type heat pipe (wicked or nonwicked) would generally be used in any particular double-sided cooling system.

Since the evaporating section (boiling surface) of the gravity-feed (nonwicked) heat pipes is relatively small compared to the large surface area in the condensing section, it is desirable to increase such boiling (evaporating) surface area and, or, change the local fluid flow patterns in order to obtain a greater maximum heat rejection rate from pressure plates 10*a* and 11*a* (and therefore also from semiconductor device 12). Therefore, for purposes of enhancing (increasing) the vaporization rate in the nonwicked heat pipes 10, 11, a "boiling surface" enhancement means 30 is formed along the evaporating surfaces of such heat pipes, (i.e., the major inner surface of each pressure plate 10*a* and 11*a*, which form one end of each such heat pipe). This boiling surface enhancement means 30 may be a layer structure of uniform thickness in a range of 10 to 50 mils of a porous metallic material such as FOAMETAL, a product of Hogen Industries, Willoughby, Ohio, which is nickel, as one typical example, having a selected porosity in the range of about 60 to 95 percent and is sintered or otherwise joined to the heat pipe evaporating surfaces for changing the local fluid flow pattern. The layer structure 30 may also be formed of porous copper or stainless steel, the latter metal not being used when the coolant is water. Alternatively, this evaporating surface enhancement means 30 may be a thin irregular surface formed by a plurality of small solid metallic members such as cylindrical or square posts or small finned surfaces (short finned structures) which are suitably joined to the heat pipe evaporating surfaces for increasing the evaporating surface area. The thin irregular surface 30 in the form of various type projecting members may be formed of the same metals as used in the layer structure, that is, nickel, copper, or stainless steel, or may be formed of other metals. As a typical example of the dimensions of the irregular surface members, they may be 0.15 inch in height, an 0.10 inch square along the top (outermost) surface and 0.15 inch center-to-center spacing between adjacent members. These projecting members can also serve as bases for the rods 16, 17 which may have their near ends soldered or otherwise joined to the top surfaces of selected ones of the projecting members.

Since heat pipes doe not utilize conduction as the heat transfer process (except for transferring the heat into and out of the heat pipe walls), and since the heat transfer through the length of each heat pipe is a substantially isothermal process of evaporation and condensation, then the condensation section of the heat pipe is at substantially the same temperature as the evaporation section except for the vaporization temperature change. This heat transfer process is also known as vapor phase heat transfer. The most distinguishing feature of the heat pipe over the conventional air cooled finned or water cooled heat sink is its ability to transfer heat along its length with substantially no temperature change and thereby is much more efficient in its cooling ability than the conventional heat sink.

In FIG. 1, the sealed chambers of the gravity-feed heat pipes 10, 11 are defined by side walls (i.e., the vertical 10*b*, 11*b*, and horizontal 10*c*, 11*c* portions of the heat pipes) and by the the pressure plates 10*a*, 11*a* as the end walls in the evaporating sections and suitable plugs as the end walls in the condenser sections. The heat pipes may be circular, square, or rectangular in cross-section as typical examples. The side walls are fabricated of a metal having a high thermal conductivity such as copper and have a thickness in the order of 40 mils. As a typical example, for a power semiconductor device having a steady-state electrical current rating of 700 amperes, each heat pipe is 8 inches in length and 1.5 square inches in cross-sectional area. The plugs are fabricated of a compatible material such as copper and are suitably connected to the condenser section ends of the heat pipes by brazing or any other well known metal joining process that assure sealed chambers within the heat pipes. The near end portions of the horizontally disposed side walls of heat pipes 10, 11 are also brazed or otherwise joined to the pressure plates (evaporating section end walls) 10*a*, 11*a* to provide the proper seals therewith. The vertically or horizontally oriented portions of the heat pipe side walls may be provided with electrically insulating collars 10*e*, 11*e* adjacent the evaporator section ends of the heat pipes in order to insulate the finned condensation sections of the heat pipes from the voltages applied to conductors 22, 23, if such isolation is desired. If the insulating collar is provided in the horizontal sections of the heat pipes, such as collar 10*e* in heat pipe 10, and insulating disk member 27 is utilized, then the high voltage regions are confined to the immediate vicinity of the semiconductor deviceheat pipe interfaces and the rods and in such case bracket 28 can be a single metallic member. Alternatively, location of the insulating collar in the vertical sections of the heat pipes, such as collar 11*e* in heat pipe 11, merely isolates the high voltage from the finned condensation section of the heat pipe, and in such case, bracket side members 28*a* are fabricated of an electrically insulating material to prevent short-circuiting across bracket end member 28*b*.

The finned heat exchanger along the outer surface of the condensation sections of the heat pipes consists of large fins 10*d*, 11*d* which may be of the folded fin or plate fin types and are fabricated of a high thermal conductivity material such as copper. The fins extend outward from the vertical side walls 10*b*, 11*b* of the heat pipes a distance generally in the range of 0.5 to 1.0 of the diameter dimension (for circular cross-section heat pipes) and 0.5 to 1.0 of the distance between opposing walls (for square or rectangular cross-section) to which they are connected. For ease of fabrication, the heat pipe is often rectangular in cross-section and the cooling fins are of length equal to the long dimension side of the heat pipe and are attached therealong.

The liquid state 10*f*, 11*f* of the two-phase fluid coolant is of small volume, and merely of sufficient depth in the evaporator section of each gravity-feed heat pipe to fully immerse the "heated" portion of the boiling surface enhancement means 30 on the pressure plates. In the case of the wicked heat pipe 40, 41 in FIG. 4, the volume of the liquid state of the coolant is usually merely sufficient to saturate the wick material 40*a*. The coolant may be water, or a freon refrigerant, as typical examples. In the case wherein the power semiconductor device is of the three electrode type, the third electrode (generally described as the gate or control electrode) is provided with connection to a third electrical conductor 42 (as depicted in FIG. 4) which may be brought out at the side of device 12 and through the increased creepage path means 15.

In operation, the heat generated in power semiconductor device 12 is conducted through cup members 13 and 14 to pressure plates 10*a* and 11*a*, respectively, which have significant heat storage capabilities. Thus, in the case of heat transients, pressure plates 10*a* and 11*a* dampen the transient and thereby reduce the temperature rise in the semiconductor device below the peak value it would attain without the presence of the pressure plates. The heat is then conducted from the pressure plates to the evaporator surface enhancement means 30 in the case of gravity-feed heat pipes at which point it vaporizes the liquid coolant. The vapor coolant then moves to the condenser section of each heat pipe due to a differential vapor pressure and condenses into the liquid state which returns to the evaporator section under the force of gravity. The heat of condensation is absorbed by the heat pipe condensation section walls which due to the large surface area have a high thermal mass, and is conducted to the finned heat exchangers **10*d*, 11*d*** and finally to the ambient air which is flowing thereby at a relatively fast rate to obtain forced air cooling of the fins.

Referring now to FIG. 4, there is shown a wicked heat pipe embodiment of our invention with a slightly different type of clamping means 43 for applying the force to compression rods 16, 17. The wicked heat pipes 40 and 41 are horizontally oriented and, except for the fact that they do not include vertical portions, and do include the wicking **40*a* along substantially the entire inner surface thereof, they are similar to the non-wicked heat pipes. The rods 16 and 17 have their far ends soldered or otherwise joined to good thermally conductive, metallic header members 44 which are joined along their opposite major end surfaces (only one header shown in FIG. 4) to backup plate members 45. As in the case of headers 20, 21 in FIG. 1, rods 16, 17 in the FIG. 4 embodiment may be joined to the near major surfaces of solid headers 44, or may pass into and be joined along the sides of holes passing completely (or partially through the header members). Each backup plate member 45 has a centrally located socket or indented far end surface into which a solid rear column member 46 is joined. The opposite end of member 46 is soldered or otherwise joined along its outer portion to a diaphragm seal 47 which functions as an end cap for the heat pipe and provides the resiliency associated with bellows 25 in FIG. 1. Diaphragm 47 has a hole centrally therethrough, and a projecting portion of the far end of member 46 passes through the hole into a socket formed centrally of a solid electrode member 48 located external of the heat pipe. The projecting portion of rear column member 46 is soldered or otherwise suitably joined to member 48 within the socket thereof. Electrode member 48 is soldered along an outer portion of its near end surface to diaphragm seal 47 on the opposite side thereof from rear column member 46. Diaphragm 47 is also provided with an annular indentation or bend which adds springiness to the diaphragm as well as functioning as a futher positioning guide for electrode member 48. The far end of electrode member 48 is soldered or otherwise joined to a U-shaped current bus 49 to which electric supply power conductor 23 is suitably connected. Members 44, 45 and 46 are each fabricated of a good thermally conductive material, preferably a metal, and in the general case wherein rods 16, 17 also function as current collectors, members 44, 45 and 46 are also electrically conductive. Members 47, 48 and 49 are fabricated of a good electrically conductive material which is preferably also a good thermal conductor. As a typical example, members 45–49 are fabricated of copper and header 44 of a zirconium-copper alloy for added strength. Members 44–49 are aligned with the clamping means 43 and with the integral semiconductor device unit. Clamp 43 may be any type suitable for developing the required force which may be as high as several tons. As a typical example, clamp 43 may consist of two parallel metal clamping rods 43*a* passing along opposite sides of the integral semiconductor device unit and heat pipe assembly in slightly spaced apart relationship therefrom, the rear rod only being shown in FIG. 4. Clamping rods 43*a* are connected together along the two ends of the assembly by two metal cross members 43*b*. Rods 43*a* are threaded at the illustrated shank ends passing through like-threaded holes in the associated first cross member 43*b*. The head ends of rods 43*a* (not shown) pass through holes in the associated second cross member 43*b* (not shown) which are aligned with the threaded holes in the first cross member. Nuts 43*c* at the shank ends of rods 43*a* are tightened against cross member 43*b* to develop the desired clamping force. Suitable electrical insulating washers between the current busses and cross members 43*b*, and electrical insulating jackets around clamping rods 43*a*** prevent electrical short circuiting through such rods.

In the FIG. 4 embodiment, the clamping force is developed by nuts **43*c* bearing against cross member 43*b*, and adjustment in such force is obtained by adjustment of nuts 43*c* which are associated with a protruding portion of the heat pipes. In contradistinction, in the FIGS. 1 and 2 embodiments the clamping force is developed by the shank ends of parts 18, 19 bearing against the curved surfaces of backplate members 26** which are associated with a recessed portion of the heat pipes.

FIG. 5 illustrates one half of another embodiment of the integral semiconductor device unit being clamped between the two evaporating surface pressure plates **10*a*, 11*a* of two heat pipes by means of compression rods 16, 17. The integral semiconductor device unit in FIG. 5 differs from that shown in FIGS. 1 and 4 primarily in the use of thick heat-conductive solid spacers 50*a* and 50*b* in pressure contact with support plates 12*d* and 12*e*, respectively. Flanges 51*a* and 51*b* are bonded along the periphery of spacers 50*a* and 50*b*, respectively, adjacent the far ends thereof, and serve as supports for ceramic insulator 15. The far end portions 50*a*' and 50*b*' of spacers 50*a* and 50*b*, respectively, have flat and parallel end surfaces for obtaining good pressure contact with the outer surfaces of pressure plates 10*a* and 11*a*. Typically, spacers 50*a*, 50*b* and flanges 51*a*, 51*b* are fabricated of copper, and the thickness of spacers 50*a* and 50*b*** is each approximately 0.4 inch for the 700 ampere, 1,200 volt rated semiconductor device described hereinabove. Thus, our compression rod invention is compatible with either the thin integral power semiconductor device unit illustrated in FIGS. 1 and 4, or the thick integral power semiconductor device unit of FIG. 5.

It is apparent from the foregoing that our invention obtains the objectives set forth in that it provides a cooling system for power semiconductor devices which is significantly superior to the conventional air cooled finned or water cooled heat sink both as to its steady-state and transient response characteristics. The use of the "pusher" rods 16, 17 obtains the desired objective of a more uniform distribution of pressure across the semiconductor device-support plate-pressure plate pressure interfaces. And since the clamping pressure is developed by adjustable members, the clamping pressure is easily removed such that the integral semiconductor device unit is readily replaceable. The rods also conduct heat away from the pressure plates and thus aid in cooling the semiconductor device. The more uniform pressure interfaces developed between the pressure plates, cup members or spacer members, and the semiconductor device by the use of our rods minimizes degradation of the various pressure contacts and thereby provide a good thermal and electrical conduction path therebetween. The location of the heat pipe evaporating surfaces in relative close proximity to the heat-emitting power semiconductor device (i.e., spaced by the thickness of the pressure plates and cup members in the FIGS. 1 and 4 embodiments) also decreases the steady-state thermal resistance as well as decreasing the transient temperature rise for long term heat overloads (for all of the embodiments) to thereby provide improved vaporization cooling of the power semiconductor device. This decreased steady-state thermal resistance results in the condenser section of our heat pipes being able to transfer heat to the ambient with greater efficiency than with conventional air cooled finned or water cooled heat sinks or with the other heat-pipe cooled power semiconductor device assemblies enumerated above in the published art and thereby obtains a lower operating temperature of the semiconductor device. The decreased steady-state thermal resistance is due also to the fact that the pressure plates are of relatively thin dimension compared to the conventional copper heat sinks of much thicker dimension previously utilized. The decreased transient temperature rise is also obtained by the fact that the walls of the heat pipe and the fluid coolant can store the heat upon the two-phase fluid evaporating in the evaporator section of the heat pipe and therefore the heat pipe walls and fluid also provide a damping of temperature rises which are of the transient type. And since the integral power semiconductor device unit includes the increased creepage path means, less cost is involved when a heat pipe must be replaced. Finally, the electrically insulating collars 10*e*, 11*e* permit the forced air-cooled portions of our assembly to be outside a cabinet in which the semiconductor device 12 and pressure plates may be mounted, and such finned portions 10*d*, 11*d* would thus be electrically isolated from the high voltage applied to the semiconductor body. Also, these electrically insulating collars permit the cooling fins to be exposed to dirty air without the possibility of increased surface conduction along the creepage path around the semiconductor body that occurs with conventional air cooled finned heat sinks or heat pipes not having such collars and operating in dirty air.

Having described two embodiments of our double-sided heat-pipe cooled power semiconductor device assembly, it is believed obvious that modification and variation of such specific embodiments may readily be made by one skilled in the art. Thus, other suitable clamping devices may be utilized to develop the required clamping pressure. Also, the assembly may readily be utilized as a single-sided cooled assembly by removing one of the heat pipes and substituting therefor a suitable base plate. The particular clamping device and resilient members illustrated in the FIGURES can be associated with nonwicked or wicked heat pipes. Finally, although rods 16, 17 are generally of equal diameter, there may be applications where different diameter rods are used in each group of rods in order to obtain a desired distribution of pressure along the pressure plates. It is, therefore, to be understood that changes may be made in our heat-pipe power semiconductor device assembly which are within the full intended scope of our invention as defined by the following claims.

What we claim as new and desire to secure by Letters Patent of the United States is:

1. A heat-pipe cooled power semiconductor device assembly comprising an integral power semiconductor device unit including a power semiconductor device consisting of a body of semiconductor material defined by first and second flat parallel major surfaces, and first and second support plates having first major surfaces forming interfaces with the first and second flat parallel surfaces of the body of semiconductor material, said support plates fabricated of an electrically conductive, high strength material having a coefficient of thermal expansion substantially equal to that of the semiconductor material, said first support plate bonded to said body of semiconductor material along the first surface thereof, said second support plate not being bonded to said body of semiconductor material but merely in pressure contact therewith to prevent damage to the body of semiconductor material due to stresses that would be induced by the thermal expansions of both support plates and body of semiconductor material when the semiconductor device is operating under normal conditions if both support plates and body of semiconductor material were bonded together, first and second members fabricated of a good thermally and electrically conductive material and having near end surfaces respectively in pressure contact with second major surfaces of said first and second support plates, and creepage path lengthening means formed along side surfaces of said members for increasing the creepage path across said integral power semiconductor device unit, first and second pressure plates having first major surfaces respectively in pressure contact with far end surfaces of said first and second members, a first heat pipe having an evaporation section and formed by said first pressure plate, a second heat pipe having an evaporation section end formed by said second pressure plate, second major surfaces of said first and second pressure plates functioning as evaporating surfaces of said first and second heat pipes, respectively, first and second groups of rods adapted to be in compression against said first and second pressure plates, respectively, and means for applying sufficiently high compressive forces against said rods to maintain substantially uniform high pressure along each of the pressure interfaces between said pressure plates, and for providing easy removal of said integral semiconductor device unit from the assembly upon release of the compressive forces, the uniformly high pressure interfaces decreasing the steady-state thermal resistance as well as improving the transient response of the assembly to obtain improved vaporization cooling of the semiconductor device.

2. The heat-pipe cooled power semiconductor device assembly set forth in claim 1 and further comprising means for connecting a pair of electrical conductors to said assembly for supplying electrical power to said power semiconductor device.

3. The heat-pipe cooled power semiconductor device assembly set forth in claim 1 wherein the rods of said first and second groups of rods are equal in number, said first and second groups of rods respectively disposed longitudinally between the second major surfaces of said first and second pressure plates and said compressive force applying means.

4. The heat-pipe cooled power semiconductor device assembly set forth in claim 1 wherein the rods of said first and second groups of rods are parallel to each other and perpendicular to the second major surfaces of said first and second pressure plates.

5. The heat-pipe cooled power semiconductor device assembly set forth in claim 1 wherein the rods of said first and second groups of rods having first ends respectively connected to the second major surfaces of said first and second pressure plates, and second ends connected to said compressive force applying means.

6. The heat-pipe cooled power semiconductor device assembly set forth in claim 1 wherein the rods are solid and fabricated of a good thermally conductive material for aiding in the transfer of heat from the semiconductor device.

7. The heat-pipe cooled power semiconductor device assembly set forth in claim 2 wherein the rods are solid and fabricated of a good thermally and electrically conductive material for both aiding in the transfer of heat from the semiconductor device and for having the rods function as electric current collectors for the electrical power supplied to said semiconductor device.

8. The heat-pipe cooled power semiconductor device assembly set forth in claim 7 wherein the rods are fabricated of copper.

9. The heat-pipe cooled power semiconductor device assembly set forth in claim 7 wherein the rods are fabricated of a zirconium-copper alloy for increased mechanical strength of the rods.

10. The heat-pipe cooled power semiconductor device assembly set forth in claim 4 wherein the rods are all equi-dimensioned and distributed substantially uniformly along the second major surfaces of said first and second pressure plates.

11. The heat-pipe cooled power semiconductor device assembly set forth in claim 5 wherein said compressive force applying means is in a recessed portion of said heat pipes.

12. The heat-pipe cooled power semiconductor device assembly set forth in claim 5 wherein said compressive force applying means is in a protruding portion of said heat pipes.

13. The heat-pipe cooled power semiconductor device assembly set forth in claim 5 wherein said compressive force applying means comprising first and second header members, the second ends of said first and second groups of rods respectively connected to said first and second header members so that the rods are rigidly supported between the pressure plates and header members, and first and second backup plate members having near ends respectively connected to far ends of said first and second header members, said header members and backup plate members aligned with the rods, said pressure plates and said integral semiconductor device unit.

14. The heat-pipe cooled power semiconductor device assembly set forth in claim 13 wherein said compressive force applying means comprising first and second threaded post members aligned with said first and second backup plate members and having convex-shaped shank ends respectively in contact with concave-shaped second ends of said first and second backup plate members, and means for retaining said post members in alignment with said backup plate members, said post member retaining means being threaded for reception of said post members therethrough from opposite directions for applying adjustable compressive forces from the shank ends of the post members against the concave-shaped ends of the backup plate members.

15. The heat-pipe cooled power semiconductor device assembly set forth in claim 14 wherein said post member retaining means is a rectangular bracket member having side members disposed parallel to sides of the assembly and spaced therefrom, and end members threaded centrally thereof for reception of said post members, said side members being in tension upon application of the compressive forces against the backup plate members as developed by rotational tightening of said post members.

16. The heat-pipe cooled power semiconductor device assembly set forth in claim 15 wherein said rectangular bracket member disposed along four sides of horizontally oriented portions of said heat pipes which contain at least the evaporating surfaces thereof, said compressive force applying means further comprising first and second bellows having first ends respectively connected along far ends of the horizontally oriented portions of said first and second heat pipes, and second ends respectively connected along protruding ends of the concave-shaped far ends of said first and second backup plate members.

17. The heat-pipe cooled power semiconductor device assembly set forth in claim 13 wherein said compressive force applying means comprising first and second rear column members aligned with said backup plate members and having near ends respectively connected to far ends of said first and second backup plate members, first and second resilient diaphragm seals respectively enclosing far ends of horizontally oriented portions of said first and second heat pipes which contain at least the evaporating surfaces thereof, said diaphragm seals each having a hole centrally thereof for passage of a projecting end of an associated said rear column member therethrough, said rear column members having peripheral portions of far ends thereof connected to near ends of the diaphragm seals, and
clamping means for applying adjustable compressive forces against far ends of said first and second rear column members which are thence transmitted through said backup plate members and header members to the rods.

18. The heat-pipe cooled power semiconductor device assembly set forth in claim 17 wherein
said compressive force applying means further comprising
first and second electrode members aligned with said rear column members and said diaphragm seals and having near ends respectively connected to far ends of said first and second rear column members and to peripheral portions of far ends of said first and second diaphragm seals, and
means connected between said clamping means and said electrode members for attaching two electrical conductors thereto for supplying electrical power to said power semiconductor device.

19. The heat-pipe cooled power semiconductor device assembly set forth in claim 1 wherein
said heat pipes are of the nonwicked gravity-return type.

20. The heat-pipe cooled power semiconductor device assembly set forth in claim 1 wherein
said heat pipes are of the wicked type.

21. The heat-pipe cooled power semiconductor device assembly set forth in claim 19 and further comprising
means connected along the second major surfaces of said pressure plates for enhancing the evaporation surfaces thereof so as to increase the rate of heat transfer from the pressure plates to a liquid coolant in the heat pipes.

22. The heat-pipe cooled power semiconductor device assembly set forth in claim 21 wherein
said evaporation surface enhancing means are a plurality of heat conductive small solid members protruding from the second surfaces of said pressure plates,
said groups of rods having first ends connected to protruding ends of selected of said small protruding members.

23. The heat-pipe cooled power semiconductor device assembly set forth in claim 1 wherein
said pressure plates are fabricated of a good thermally and electrically conductive material.

24. The heat-pipe cooled power semiconductor device assembly set forth in claim 23 wherein
said pressure plates are each of thickness in the range of 100 to 300 mils.

25. The heat-pipe cooled power semiconductor device assembly set forth in claim 1 wherein
said support plates are each of approximately 40 mils thickness.

26. The heat-pipe cooled power semiconductor device assembly set forth in claim 1 wherein
said members are cup-shaped and each of thickness in the range of 25 to 100 mils.

27. The heat-pipe cooled power semiconductor device assembly set forth in claim 1 wherein
said members are relatively thick solid spacer members each of thickness approximately 0.4 inch.

28. The heat-pipe cooled power semiconductor device assembly set forth in claim 13 and further comprising
first and second electrical conductors respectively connected to said first and second header members,
said first and second groups of rods fabricated of a good thermally and electrically conductive material so that the rods conduct heat away from the pressure plates to further aid cooling of said semiconductor device and also function as electric current collectors for supplying electric current to said semiconductor device.

29. The heat-pipe cooled power semiconductor device assembly set forth in claim 28 and further comprising
electrical insulating members connected between said header members and said backup plate members,
electrical insulating collars provided in walls of said heat pipes closely adjacent said integral power semiconductor device unit, and
electrical insulating bushings provided in walls of said heat pipes in the region of said header members for passage of said electrical conductors therethrough in electrical isolation from the heat pipe walls, said header members fabricated of a good thermally and electrically conductive material so that the only external portions of the heat pipes which are at the voltages applied to the semiconductor device are the regions between the electrical insulating collars.

30. The heat-pipe cooled power semiconductor device assembly set forth in claim 13 and further comprising
first and second electrical conductors respectively connected to outer surfaces of walls of said first and second heat pipes,
said first and second groups of rod fabricated of a good thermally conductive material so that the rods conduct heat away from the pressure plates to further aid cooling of said semiconductor device.

31. The heat-sink cooled power semiconductor device assembly set forth in claim 1 wherein
said creepage path lengthening means comprise a unitary layer of an electrically insulating material formed along outer side surfaces of said first and second members.

32. The heat-sink cooled power semiconductor device assembly set forth in claim 31 wherein
the unitary layer is of a ceramic composition and provides a hermetic seal around said power semiconductor device.

33. The heat-sink cooled power semiconductor device assembly set forth in claim 31 wherein
the unitary layer is of a rubber composition and fills the entire void between said first and second members.

* * * * *

65